US012635505B2

(12) United States Patent
Lanzillo et al.

(10) Patent No.: US 12,635,505 B2
(45) Date of Patent: May 19, 2026

(54) POWER DELIVERY NETWORK HAVING SUPER VIAS IN AN INTEGRATED CIRCUIT

(71) Applicant: International Business Machines Corporation, Armonk, NY (US)

(72) Inventors: Nicholas Anthony Lanzillo, Wynantskill, NY (US); David Wolpert, Poughkeepsie, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 17/932,327

(22) Filed: Sep. 15, 2022

(65) Prior Publication Data

US 2024/0096801 A1 Mar. 21, 2024

(51) Int. Cl.
| | |
|---|---|
| *H10W 20/42* | (2026.01) |
| *H10W 20/20* | (2026.01) |
| *H10W 20/41* | (2026.01) |

(52) U.S. Cl.
CPC ......... *H10W 20/427* (2026.01); *H10W 20/20* (2026.01); *H10W 20/42* (2026.01)

(58) Field of Classification Search
CPC .............. H01L 23/5286; H01L 23/481; H01L 23/5226; H10W 20/427; H10W 20/20; H10W 20/42
USPC ........................................................ 257/774
See application file for complete search history.

(56) References Cited

U.S. PATENT DOCUMENTS

| | | | |
|---|---|---|---|
| 6,028,440 A | 2/2000 | Roethig et al. | |
| 6,308,307 B1 | 10/2001 | Cano et al. | |
| 7,272,803 B1 | 9/2007 | Hsu | |
| 8,247,906 B2 | 8/2012 | Law et al. | |
| 9,887,133 B2 | 2/2018 | Chi et al. | |
| 9,911,651 B1 * | 3/2018 | Briggs .............. | H01L 21/76811 |
| 10,020,254 B1 | 7/2018 | Bao et al. | |
| 10,026,687 B1 | 7/2018 | Lin et al. | |
| 10,283,407 B2 | 5/2019 | Chi et al. | |
| 10,553,789 B1 | 2/2020 | Lanzillo et al. | |
| 10,607,938 B1 | 3/2020 | Rubin et al. | |
| 10,886,224 B2 | 1/2021 | Gerousis et al. | |
| 2008/0098340 A1 | 4/2008 | Oh | |
| 2008/0195986 A1 | 8/2008 | Cohen et al. | |
| 2018/0342460 A1 | 11/2018 | Gudala et al. | |
| 2021/0202377 A1 | 7/2021 | Elsherbini et al. | |

* cited by examiner

*Primary Examiner* — Tu-Tu V Ho
(74) *Attorney, Agent, or Firm* — CANTOR COLBURN LLP; L. Jeffrey Kelly

(57) ABSTRACT

Embodiments include super via placement in the development of an integrated circuit. Aspects of the invention include obtaining a power distribution network for the integrated circuit (IC) IC, wherein the PDN includes a plurality of metal vias each configured to connect adjacent metal layers of a plurality of metal layers. Aspects also include placing one or more cells on each metal layer of the IC and identifying a power demand associated with each of the one or more cells. Aspects further include updating the PDN, based on the power demand associated with each of the one or more cells, to replace at least two of the plurality of metal vias with a super via that is configured to connect non-adjacent metal layers of the plurality of metal layers.

19 Claims, 9 Drawing Sheets

110

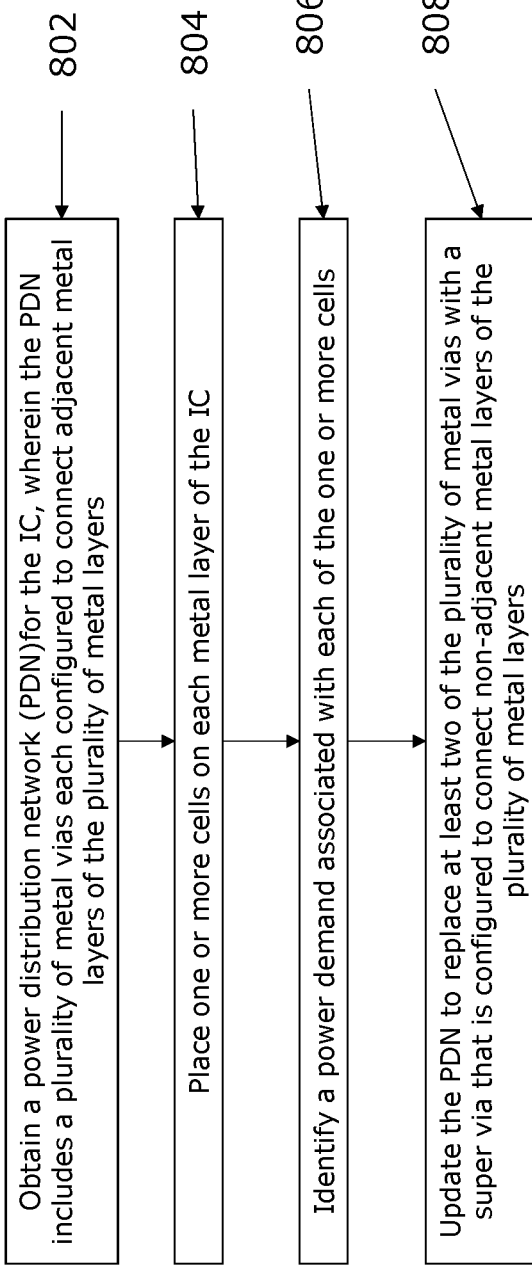

800

Obtain a power distribution network (PDN) for the IC, wherein the PDN includes a plurality of metal vias each configured to connect adjacent metal layers of the plurality of metal layers
802

Place one or more cells on each metal layer of the IC
804

Identify a power demand associated with each of the one or more cells
806

Update the PDN to replace at least two of the plurality of metal vias with a super via that is configured to connect non-adjacent metal layers of the plurality of metal layers
808

FIG. 8

POWER DELIVERY NETWORK HAVING SUPER VIAS IN AN INTEGRATED CIRCUIT

BACKGROUND

The present invention generally relates to integrated circuit development, and more specifically, to a power delivery network having super vias in an integrated circuit.

The development of an integrated circuit (i.e., chip) involves several stages from design through fabrication. The chip may be subdivided into hierarchical levels to simplify design and testing tasks at different stages. Generally, a cell or macro may be regarded as a sub-section of the chip. The chip includes a power delivery network that is configured to provide power across the hierarchical levels to each of the cells of the chip.

SUMMARY

Embodiments of the present invention are directed to super via placement in a power delivery network during the development of an integrated circuit. A non-limiting example computer-implemented method includes obtaining a power distribution network for the integrated circuit (IC) IC, wherein the PDN includes a plurality of metal vias each configured to connect adjacent metal layers of a plurality of metal layers. The method also includes placing one or more cells on each metal layer of the IC and identifying a power demand associated with each of the one or more cells. The method further includes updating the PDN, based on the power demand associated with each of the one or more cells, to replace at least two of the plurality of metal vias with a super via that is configured to connect non-adjacent metal layers of the plurality of metal layers.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 8 is a process flow of a method of for super via placement in a power delivery network during the development of an integrated circuit according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, integrated circuit (IC) development may involve several stages that include the schematic design, floorplan layout, and fabrication. As also noted, integrated circuits include power delivery networks that are configured to distribute power to each cell across the levels of the integrated circuit. In general, the power delivery network includes one or more power distribution rails disposed on each metal layer of the IC. Vias are disposed between each adjacent metal layer to provide power distribution between the layers. At each metal-to-metal junction of a via and a metal layer, there is a resistance that reduces the current flow across the via. As a result, in cases where the power demands of devices disposed on a metal layer are not substantially equal, a non-uniform current distribution can be provided to the devices 310, which results in a clock skew across the devices.

Embodiments of the present invention overcome the shortcomings of the current methods by the placement of super vias, which are vias that directly connect nonadjacent metal layers, in the power delivery network of an integrated circuit. In exemplary embodiments, a power delivery network for an IC is obtained and devices, or cells, are placed on each metal layer. After a power demand for each device is obtained, one or more of the stacked vias of the power delivery network are replaced with a super via. In exemplary embodiments, the location of the super vias are determined based on the power demands of the devices on the IC, such that devices with a higher power demand are located nearer to a super via than a stacked via. In exemplary embodiments, the replacement of stacked vias with super vias is configured to provide a uniform current distribution across each metal layer and thereby reduce clock skew across the devices disposed on a metal layer.

Figure 1:
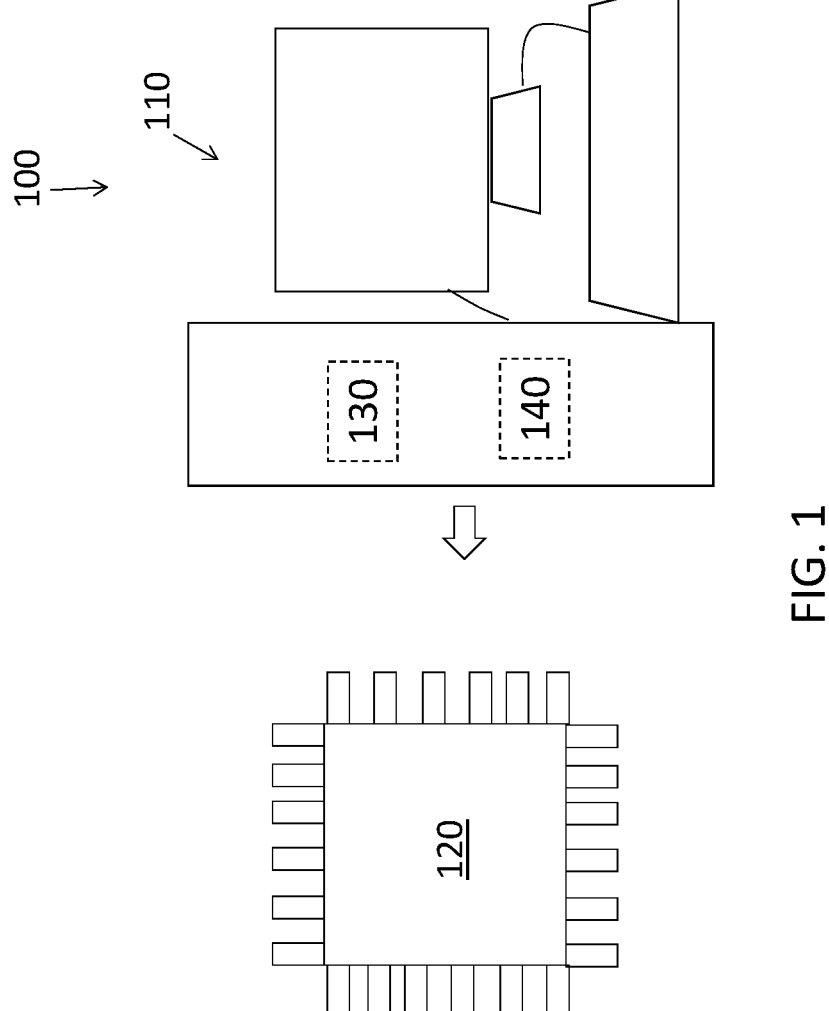
FIG. 1 is a block diagram of a system to perform the development of an integrated circuit using thermally coupled aware device placement according to one or more embodiments of the invention.

FIG. 1 is a block diagram of a system 100 to perform super via placement in the development of an integrated circuit according to embodiments of the invention. The system 100 includes processing system 110 used to generate the design that is ultimately fabricated into an integrated circuit 120. The steps involved in the fabrication of the integrated circuit 120 are well-known and briefly described herein. Once the physical layout is finalized, design data is provided to a foundry where masks are generated for each layer of the integrated circuit based on the finalized physical layout. Then, the wafer is processed in the sequence of the mask order. The processing includes photolithography and etch. This is further discussed with reference to FIG. 16.

Figure 2:
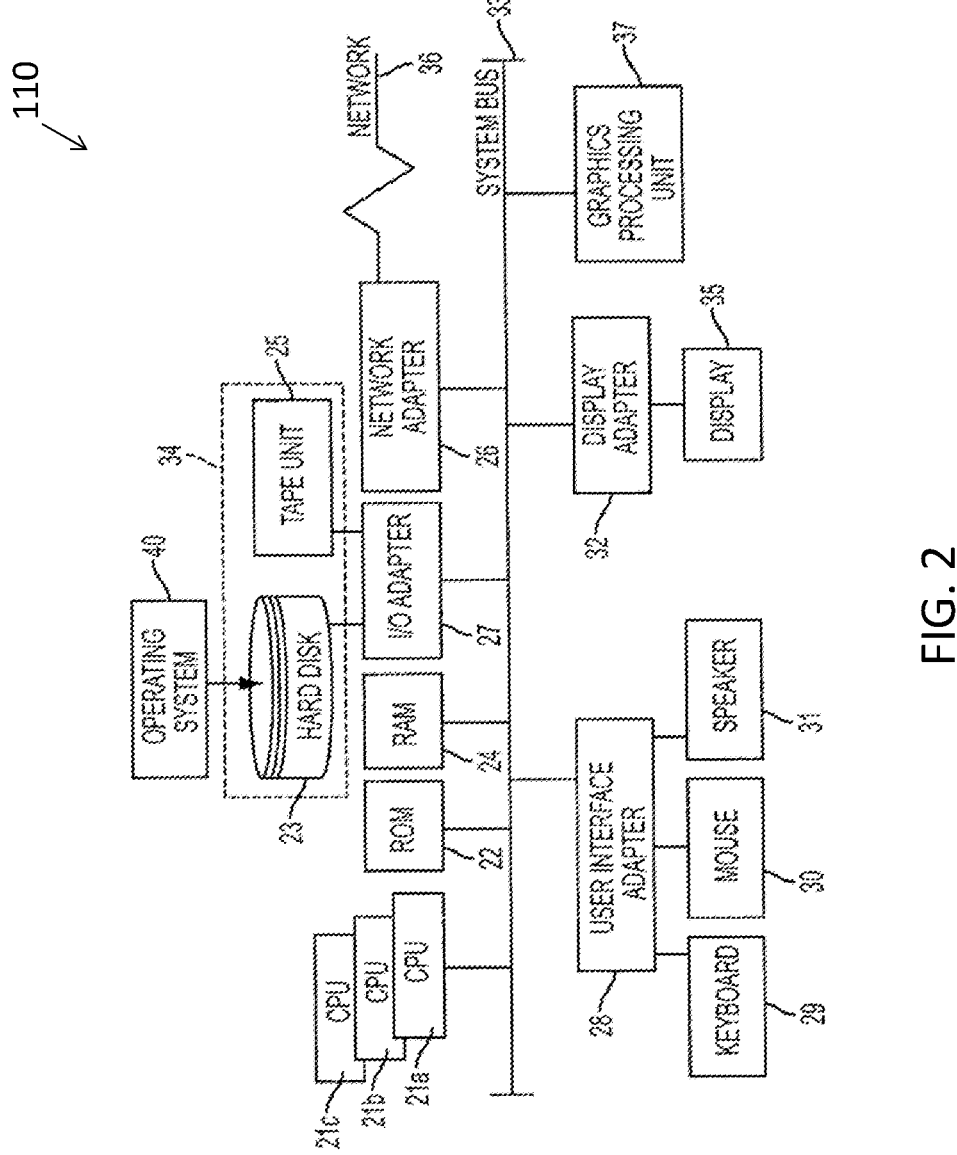
FIG. 2 is a block diagram of a processing system to generate the design that is fabricated into the integrated circuit according to one or more embodiments of the invention.

FIG. 2 is a block diagram of a processing system 110 used to generate the design that is fabricated into the integrated circuit 120. The processing system 110 has one or more central processing units (processors) 21*a*, 21*b*, 21*c*, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of processing system 110.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage device 25 or any other similar component. I/O adapter 27, hard disk 23, and tape storage device 25 are collectively referred to herein as mass storage 34. Operating system 40 for execution on processing system 110 can be stored in mass storage 34. The RAM 22, RAM 24, and mass storage 34 are examples of memory 19 of the processing system 110. A network adapter 26 interconnects system bus 33 with an outside network 36 enabling the processing system 110 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, processing system 110 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, processing system 110 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the processing system 110.

Figure 3:
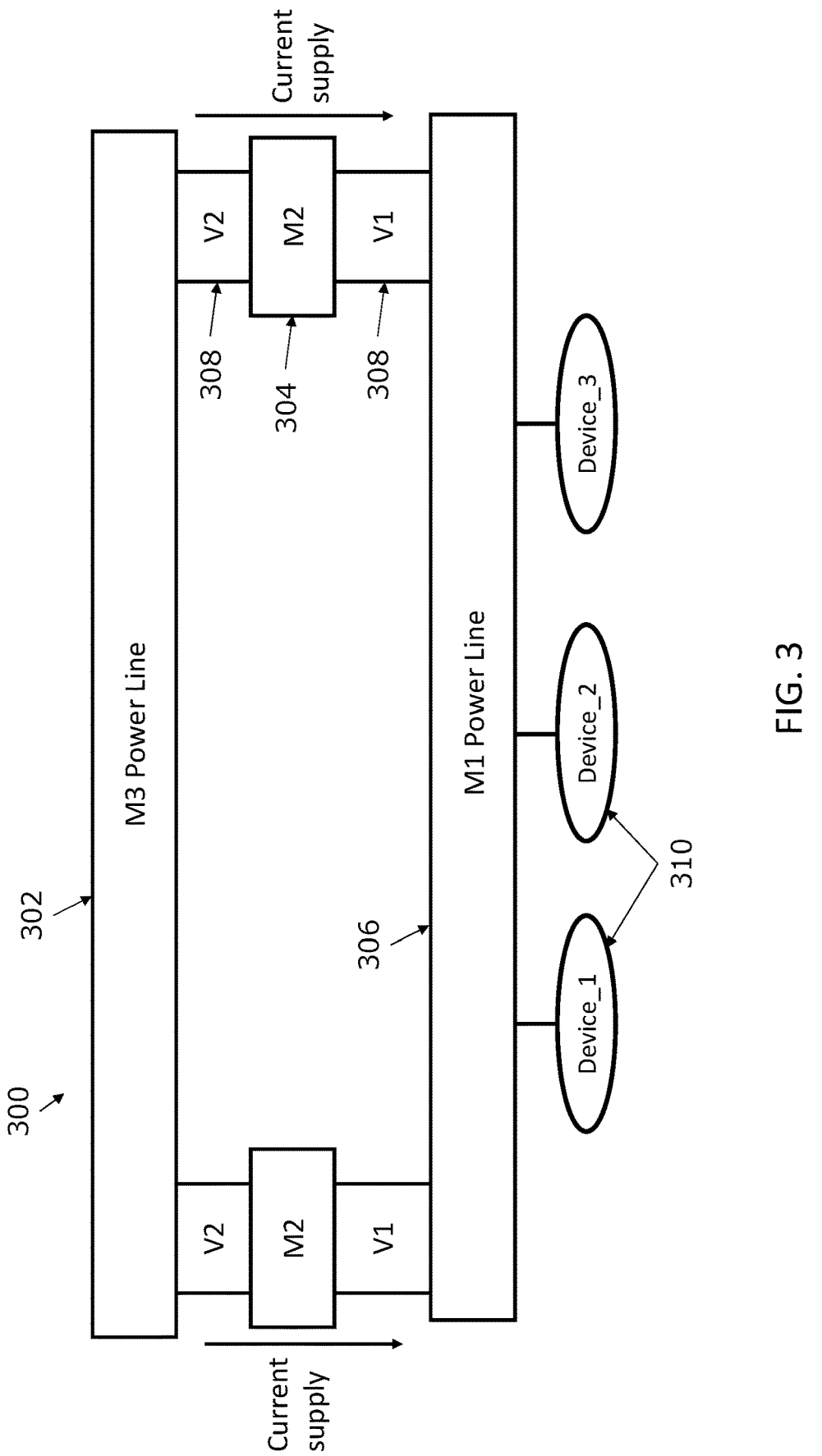
FIG. 3 is a block diagram of a power delivery network in an integrated circuit.

Referring now to FIG. 3 a block diagram of a power delivery network 300 in an integrated circuit is shown. As illustrated, the power delivery network 300 is configured to provide power to devices 310, also referred to herein as cells, which are connected to metal layer M1 306. Metal layer M1 306 is connected to metal layer M2 304 by a plurality of vias 308 and metal layer M2 304 is connected to metal layer M3 302 by a plurality of vias 308. In exemplary embodiments, power is received by metal layer M3 302, or a higher-level metal layer, and current flows down through vias 308 and metal layers M2 304 and M1 306 to the devices 310. As described above, in cases where the power demands of the devices 310 are not substantially equal, a non-uniform current distribution can occur to the devices 310, which results in a clock skew across the devices 310.

Figure 4:
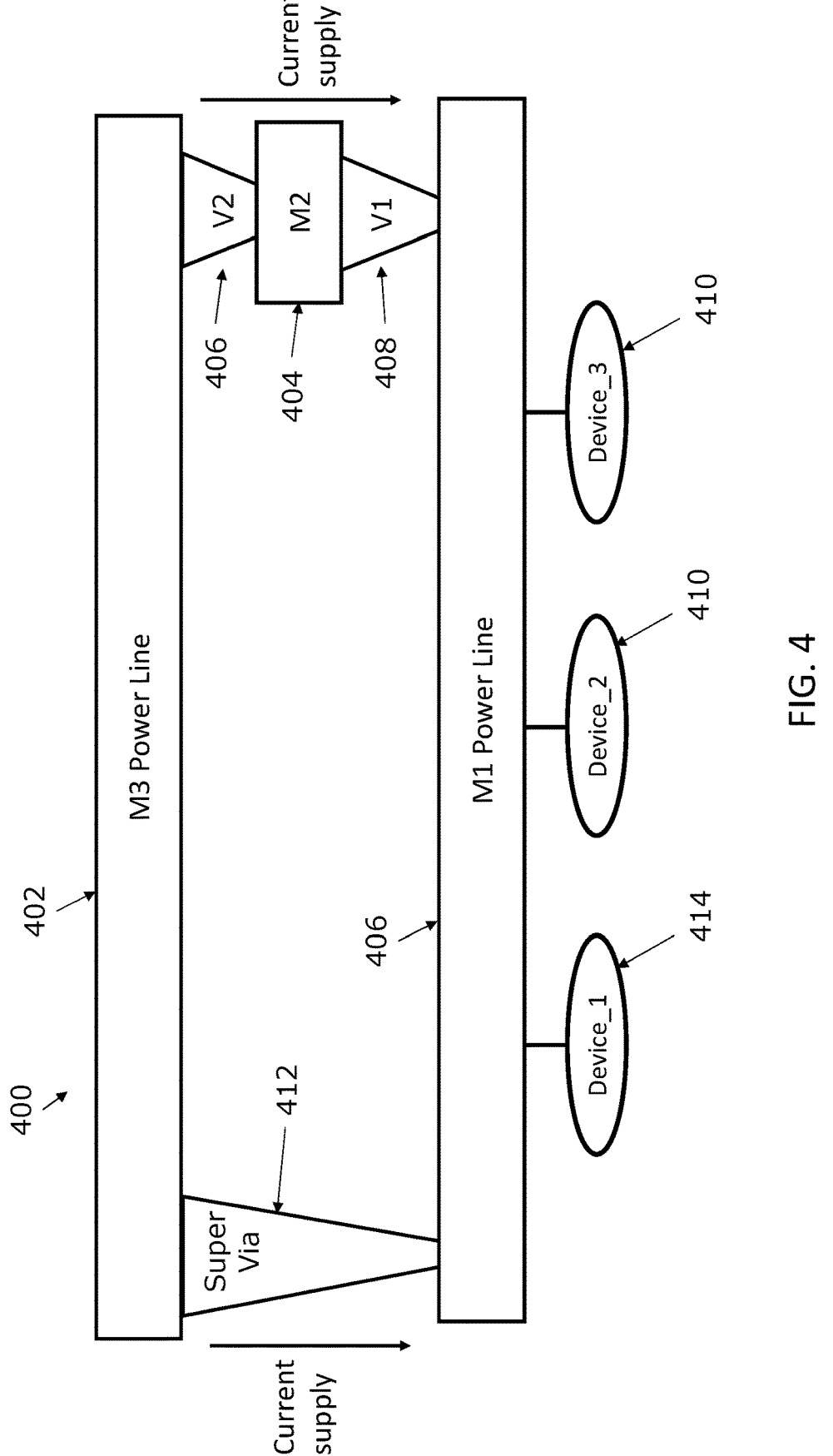
FIG. 4 is a block diagram of a power delivery network in an integrated circuit according to one or more embodiments of the invention.

Referring now to FIG. 4, a block diagram of a power delivery network 400 in an integrated circuit according to one or more embodiments of the invention is shown. As illustrated, the power delivery network 400 is configured to provide power to devices 410 and 414, which are connected to metal layer M1 406. In exemplary embodiments, device 414 has a power demand that is greater than the power demand of devices 410. Metal layer M1 406 is connected to metal layer M2 404 by a via 408 and to metal layer M3 402 by a super via 412. Metal layer M2 404 is connected to metal layer M3 402 by a vias 408. In exemplary embodiments, power is received by metal layer M3 402, or a higher-level metal layer, and current flows down through via 408 and metal layer M2 404 and through super via 412 to metal layer M1 406. In exemplary embodiments, the super via 412 is configured to provide a higher current flow from metal layer M3 402 to metal layer 406 than the current provided through vias 408 and metal layer M2 404 because of the added resistance of the metal-to-metal interfaces between vias 408 and metal layer M2 404. In exemplary embodiments, the super via 412 maximizes the charge available for device 414 and enables a more uniform current distribution across metal layer M1 406 thereby reducing clock skew among devices 410, 414.

Figure 5:
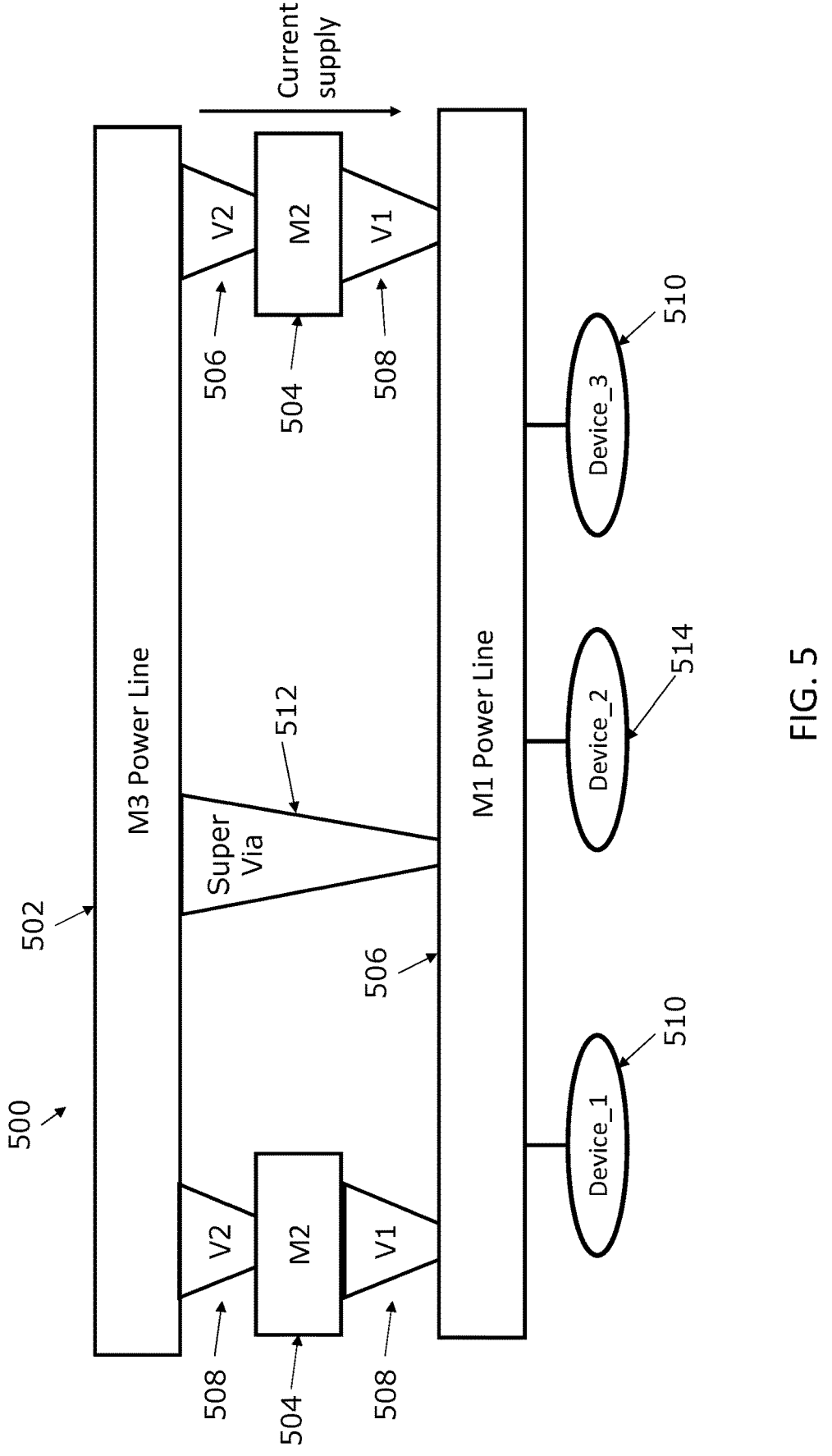
FIG. 5 is a block diagram of a power delivery network in an integrated circuit according to one or more embodiments of the invention.

Referring now to FIG. 5 a block diagram of a power delivery network 500 in an integrated circuit according to one or more embodiments of the invention is shown. As illustrated, the power delivery network 500 is configured to provide power to devices 510 and 514, which are connected to metal layer M1 506. In exemplary embodiments, device 514 has a power demand that is greater than the power demand of devices 510. Metal layer M1 506 is connected to metal layer M2 504 by vias 508 and to metal layer M3 502 by a super via 512. Metal layer M2 504 is connected to metal layer M3 502 by vias 508. In exemplary embodiments, power is received by metal layer M3 502, or a higher-level metal layer, and current flows down through vias 408 and metal layer M2 404 and through super via 512 to metal layer M1 506. In exemplary embodiments, the super via 512 is configured to provide a higher current flow from metal layer M3 502 to metal layer M1 506 that the current provided through vias 508 and metal layer M2 504 because of the added resistance of the metal-to-metal interfaces between vias 508 and metal layer M2 504. In exemplary embodiments, the super via 512 maximizes the charge available for device 514 and enables a more uniform current distribution across metal layer M1 506 thereby reducing clock skew among devices 510, 514.

Figure 6:
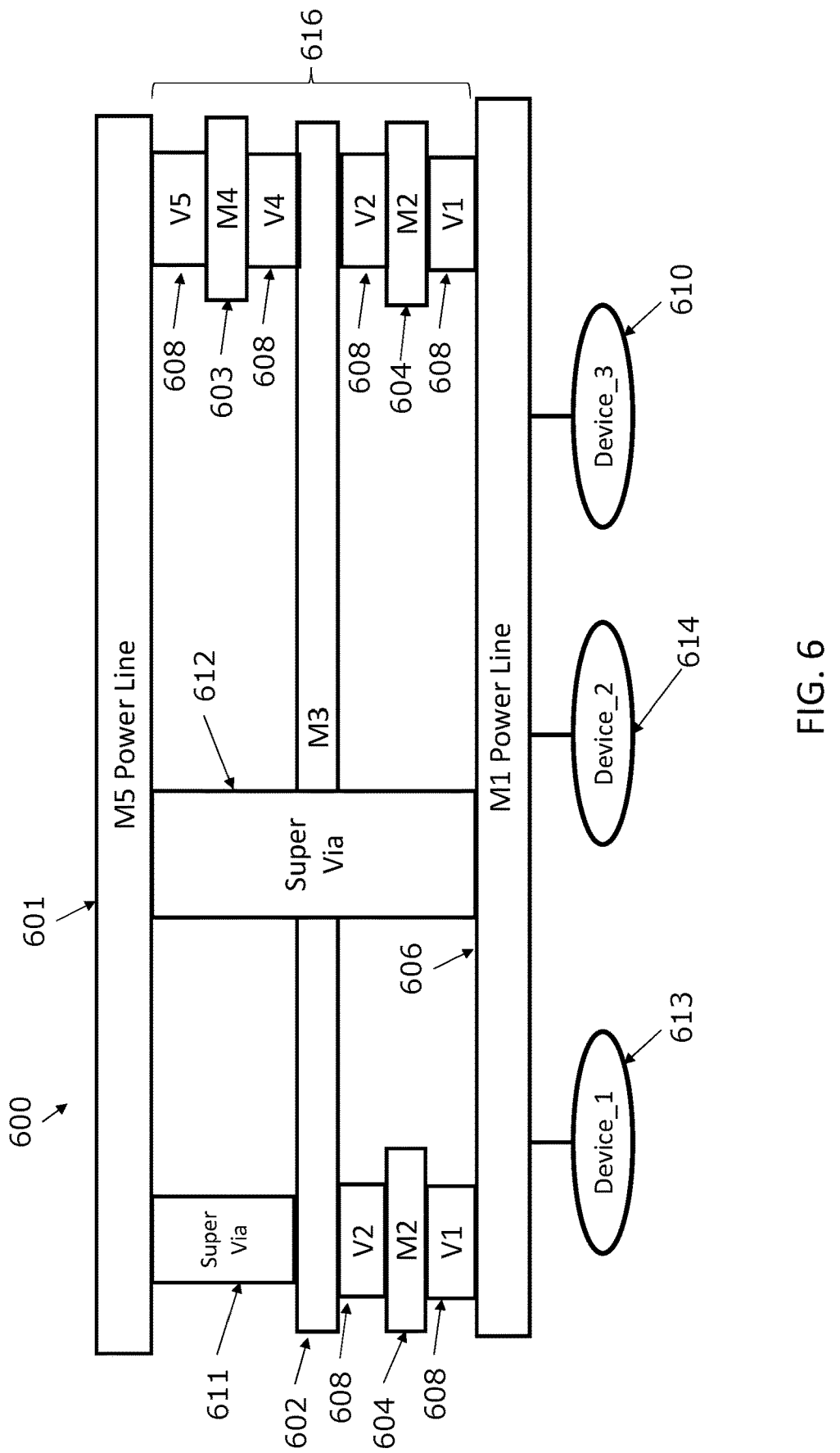
FIG. 6 is a block diagram of a power delivery network in an integrated circuit according to one or more embodiments of the invention.

Referring now to FIG. 6 is a block diagram of a power delivery network 600 in an integrated circuit according to one or more embodiments of the invention is shown. As illustrated, the power delivery network 600 is configured to provide power to devices 610 and 614, which are connected to metal layer M1 606. In exemplary embodiments, device 614 has a power demand that is greater than the power demand of device 613, which has a power demand greater than the power demand of device 610. Metal layer M5 601 is connected to metal layer M4 603 by via 608, to metal layer M3 602 by a super via 611, and to metal layer M1 606 by super via 612. Metal layer M4 504 is connected to metal layer M3 602 by via 508. Metal layer M3 602 is connected to metal layer M2 604 by vias 608 and metal layer M2 604 is connected to metal layer M1 by vias 608.

In exemplary embodiments, the power delivery network includes multiple super vias that connect various nonadjacent metal layers, such as super via 611 and super via 612. In one embodiment, the super vias 611 and 612 have a different size, i.e., super via 612 has a greater cross-sectional area than super via 611. In exemplary embodiments, the size of a super via is positively correlated with a number of intervening metal layers the super via bypasses or skips.

In exemplary embodiments, the super via 612 is configured to provide a higher current flow from metal layer M5 601 to metal layer M1 606 than the current provided through vias 508 and metal layers M4 603, M3 602, and M2 604 because of to the added resistance of the metal-to-metal interfaces between vias 508 and metal layers. Likewise, super via 611 is configured to provide a higher current flow from metal layer M5 601 to metal layer M1 606 than the current provided through vias 508 and metal layers M4 603, M3 602, and M2 604 because of the added resistance of the metal-to-metal interfaces between vias 508 and metal layers. In exemplary embodiments, the super via 612 provides a first current flow to device 614, super via 611 provides a second current flow to device 611, and the stacked vias 616 provide a third current flow to device 610. The first current flow is greater than the second current flow, which is greater than the third current flow. In exemplary embodiments, by providing power taps with different current flows to supply devices having different current demands, a more uniform current distribution across metal layer M1 506 can be achieved, which will reduce clock skew among devices 610, 611 and 614.

Figure 7:
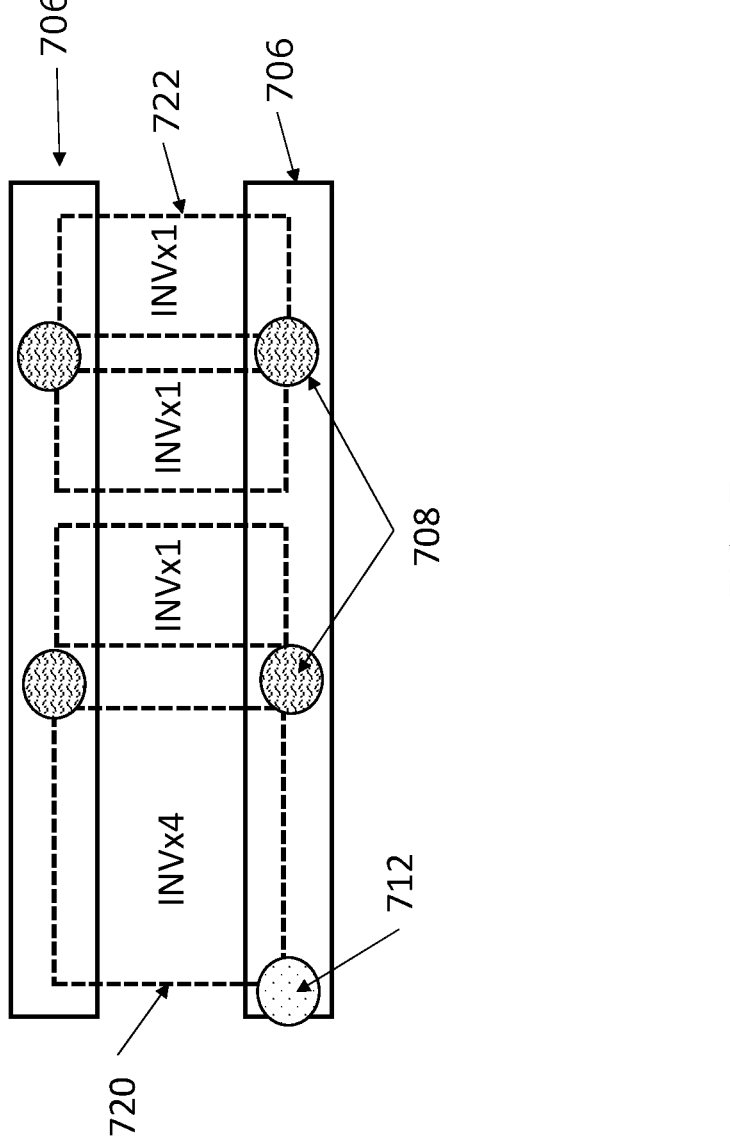
FIG. 7 is a block diagram of a power delivery network in an integrated circuit according to one or more embodiments of the invention.

Referring now to FIG. 7, a block diagram of a top view a power delivery network in an integrated circuit 700 according to one or more embodiments of the invention is shown. As illustrated, the IC 700 includes two power distribution rails 706 a plurality of stacked vias 708 and a super via 712. The IC 700 includes a first cell 720 that is driven by the super via 712 and second cells 722 that are driven by one of the stacked vias 708. In exemplary embodiments, the area of the first cell 720 is larger than the area of the second cell 722.

Referring now to FIG. 8, a process flow of a method 800 for super via placement in a power delivery network (PDN) during the development of an integrated circuit (IC) according to one or more embodiments of the invention is shown. The method 800 begins at block 802 by obtaining the PDN for the IC. The PDN includes a plurality of metal vias each configured to connect adjacent metal layers of the plurality of metal layers. Next, as shown at block 804, the method 800 includes placing one or more cells on each metal layer of the IC. The power demand associated with each of the one or more cells is identified, as shown at block 806. Once the power demand for each of the one or more cells is determined, the method 800 proceeds to block 808 and updates the PDH by replacing at least two of the plurality of metal vias with a super via that is configured to connect nonadjacent metal layers of the plurality of metal layers.

In exemplary embodiments, the replacement of the two or more plurality of metal vias with a super via is performed based at least in part on the power demand associated with each of the one or more cells. In other words, the location of a super via in the power distribution network is determined based on the power demand associated with each of the one or more cells. In one embodiment, a distance between a super via on a metal layer to which it is supplying power and at least one of the one or more cells on that metal layer is inversely related to the power demand associated with the at least one of the one or more cells, i.e., the cells or devices having higher power demands are disposed closer to the super vias than to traditional power taps.

In exemplary embodiments, updating the PDN includes placing a plurality of super vias in the PDN. In exemplary embodiments, the plurality of super vias include super vias that are configured to connect different metal layers. For example, a PDN may include a first super via that connects metal layer M1 to metal layer M3, replacing two traditional vias, and a second super via that connects metal layer M1 to metal layer M5, replacing four traditional vias.

In exemplary embodiments, the plurality of super vias in the PDN include super vias that have different dimensions, e.g., length and width or cross-sectional area, to provide for different levels of current flow through the super via. In one embodiment, the cross-sectional area of a super via is positively correlated with a number of metal layers the super via skips. For example, a first super via that connects metal layer M1 to metal layer M3 would have a smaller cross-sectional area than a second super via that connects metal layer M1 to metal layer M5.

Figure 9:
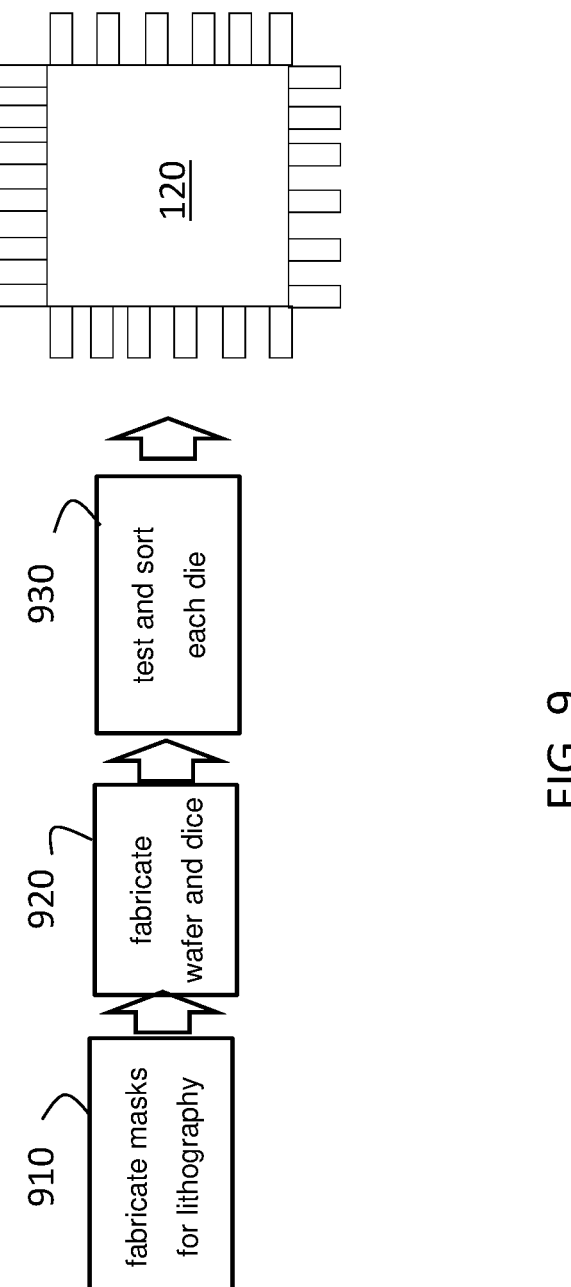
FIG. 9 is a process flow of a method of fabricating the integrated circuit according to exemplary embodiments of the invention.

FIG. 9 is a process flow of a method of fabricating the integrated circuit according to exemplary embodiments of the invention. Once the physical design data is obtained, based, in part, on the processes discussed with reference to FIG. 8, the integrated circuit 120 can be fabricated according to known processes that are generally described with reference to FIG. 9. Generally, a wafer with multiple copies of the final design is fabricated and cut (i.e., diced) such that each die is one copy of the integrated circuit 120. At block 910, the processes include fabricating masks for lithography based on the finalized physical layout. At block 920, fabricating the wafer includes using the masks to perform photolithography and etching. Once the wafer is diced, testing and sorting each die is performed, at block 930, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for designing an integrated circuit (IC) having a plurality of metal layers, the method comprising:
   obtaining a power distribution network (PDN) for the IC, wherein the PDN includes a plurality of metal vias each configured to connect adjacent metal layers of the plurality of metal layers;
   placing one or more cells on each metal layer of the IC;
   identifying a power demand associated with each of the one or more cells;
   updating the PDN, based on the power demand associated with each of the one or more cells, to replace at least two of the plurality of metal vias with a super via that is configured to connect non-adjacent metal layers of the plurality of metal layers.

2. The method of claim 1, wherein a location of the super via is determined based on the power demand associated with each of the one or more cells.

3. The method of claim 2, wherein a distance between the location of the super via and at least one of the one or more cells is inversely related to the power demand associated with the at least one of the one or more cells.

4. The method of claim 1, wherein the super via is configured to replace four or more of the plurality of metal vias.

5. The method of claim 1, wherein updating the PDN includes placing a plurality of super vias including the super via.

6. The method of claim 5, wherein at least two super vias of the plurality of super vias have different dimensions.

7. The method of claim 6, wherein the dimensions include a cross sectional area.

8. An integrated circuit (IC) device comprising:
   a plurality of metal layers;

a plurality of cells disposed on each metal layer, each cell having a power demand; and a power distribution network (PDN) configured to provide power to the plurality of cells, the PDN comprising:

a plurality of vias, wherein each via is metal connection between two adjacent metal layers of the plurality of metal layers; and at least one super via that is a metal connection between two non-adjacent metal layers of the plurality of metal layers, wherein a location of the super via is based at least in part on the power demand associated with one or more of the plurality of cells, wherein a distance between the location of the super via and the one or more of the plurality of cells is inversely related to the power demand associated with the one or more of the plurality of cells.

9. The IC device of claim 8, wherein the super via connects two metal layers of the plurality of metal layers that have two or more intervening metal layers of the plurality of metal layers disposed in between.

10. The IC device of claim 8, wherein the power distribution network includes a plurality of super vias.

11. The IC device of claim 10, wherein at least two super vias of the plurality of super vias have different dimensions.

12. The IC device of claim 11, wherein the dimensions include a cross-sectional area.

13. A computer program product comprising a computer readable storage medium having program instructions embodied therewith, the program instructions executable by a processor to cause the processor to perform operations comprising:

obtaining a power distribution network (PDN) for the integrated circuit (IC), wherein the PDN includes a plurality of metal vias each configured to connect adjacent metal layers of a plurality of metal layers;

placing one or more cells on each metal layer of the IC;

identifying a power demand associated with each of the one or more cells;

updating the PDN, based on the power demand associated with each of the one or more cells, to replace at least two of the plurality of metal vias with a super via that is configured to connect non-adjacent metal layers of the plurality of metal layers.

14. The computer program product of claim 13, wherein a location of the super via is determined based on the power demand associated with each of the one or more cells.

15. The computer program product of claim 14, wherein a distance between the location of the super via and at least one of the one or more cells is inversely related to the power demand associated with the at least one of the one or more cells.

16. The computer program product of claim 13, wherein the super via is configured to replace four or more of the plurality of metal vias.

17. The computer program product of claim 13, wherein updating the PDN includes placing a plurality of super vias including the super via.

18. The computer program product of claim 17, wherein at least two super vias of the plurality of super vias have different dimensions.

19. The computer program product of claim 18, wherein the dimensions include a cross sectional area.

* * * * *